(12) United States Patent
Hida et al.

(10) Patent No.: US 8,517,392 B2
(45) Date of Patent: Aug. 27, 2013

(54) ELECTROSTATIC CHUCK AND MANUFACTURING METHOD THEREOF

(75) Inventors: Tsuyoshi Hida, Nirasaki (JP); Takashi Yamamoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1189 days.

(21) Appl. No.: 12/410,873

(22) Filed: Mar. 25, 2009

(65) Prior Publication Data

US 2009/0243236 A1 Oct. 1, 2009

Related U.S. Application Data

(60) Provisional application No. 61/055,553, filed on May 23, 2008.

(30) Foreign Application Priority Data

Mar. 28, 2008 (JP) .................................. 2008-085417

(51) Int. Cl.
*B23B 31/28* (2006.01)

(52) U.S. Cl.
USPC ......................................... 279/128; 361/234

(58) Field of Classification Search
USPC ......................................... 279/128; 361/234
IPC ....................................................... B23B 31/28
See application file for complete search history.

(56) References Cited

U.S. PATENT DOCUMENTS

| | | | | |
|---|---|---|---|---|
| 5,986,874 A | * | 11/1999 | Ross et al. | 361/234 |
| 2005/0127619 A1 | * | 6/2005 | Tateno et al. | 279/128 |
| 2008/0230181 A1 | * | 9/2008 | Higuma et al. | 156/345.51 |

FOREIGN PATENT DOCUMENTS

| | | |
|---|---|---|
| JP | 6-279974 | 10/1994 |
| JP | 11-33771 | 2/1999 |

OTHER PUBLICATIONS

Office Action issued Aug. 19, 2010, in China Patent Application No. 200910127054.3 (with English-language Translation).
Office Action issued Mar. 23, 2011, in Korean Patent Application No. 10-2009-0026291 with English translation.

* cited by examiner

*Primary Examiner* — Eric A Gates
(74) *Attorney, Agent, or Firm* — Rothwell, Figg, Ernst & Manbeck, P.C.

(57) ABSTRACT

An electrostatic chuck of a stack structure includes a metal layer interposed between insulating layers and a groove formed at a peripheral portion of the electrostatic chuck to have a thickness gradually increasing toward an outside, the groove being covered with a thermally sprayed insulating film. The thermally sprayed film covers at least a portion of the metal layer exposed at an inside of the groove such that the thermally sprayed film does not protrude from the groove.

13 Claims, 5 Drawing Sheets

ELECTROSTATIC CHUCK AND MANUFACTURING METHOD THEREOF

FIELD OF THE INVENTION

The present invention relates to an electrostatic chuck used in a mounting table on which a substrate to be processed, such as a semiconductor wafer, is mounted; and more particularly, to an electrostatic chuck including a thermally sprayed ceramic coating (hereinafter, also referred to as a thermally sprayed layer) and a manufacturing method thereof.

BACKGROUND OF THE INVENTION

In a semiconductor processing apparatus that performs plasma etching on a substrate to be processed, such as a silicon wafer, the substrate is mounted on a mounting table installed at the center of a processing chamber. The mounting table generally has a structure in which an electrostatic chuck (hereinafter, referred to as an 'ESC') is provided at the top of a support made of a metal material exhibiting high thermal conductivity.

Generally, the electrostatic chuck has a stack structure including an insulating (dielectric) layer disposed at an uppermost portion of the electrostatic chuck, a film-shaped electrode, which is a conductive layer and is disposed below the insulating layer, and an insulating layer disposed below the film-shaped electrode. The insulating layer is generally made of alumina ($Al_2O_3$). An aluminum sheet, an aluminum foil, or an aluminum joint layer is generally used as the film-shaped electrode. The film-shaped electrode functions as a voltage application electrode to hold the wafer with an electrostatic force.

Also, in addition to the film-shaped electrode, a heat transfer layer made of a metal material may be provided at the ESC to render the temperature of the ESC uniform.

The film-shaped electrode and the heat transfer layer are metal layers made of an electrically conductive metal material. Both the film-shaped electrode and the heat transfer layer are exposed from a peripheral side surface of the ESC. When the ends of the metal layers are exposed from the peripheral side surface of the ESC, the metal layers may be corroded by, for example, a halogen-based corrosion gas used to manufacture semiconductors. Also, the corroded metal may cause contamination.

Also, when the film-shaped electrode is used as an electrode of the ESC, an electric discharge or an electric leakage to a metal body adjacent to the film-shaped electrode, e.g., a focus ring installed at a periphery of the ESC, may occur because a high voltage is applied to the film-shaped electrode.

Accordingly, an insulating ceramic material or alumina may be thermally sprayed on the peripheral side surface of the ESC from which the metal layers are exposed in order to prevent the occurrence of the above-mentioned problem.

For example, Patent Document 1 discloses a susceptor used in the manufacture of semiconductors and having a conductor and an insulating ceramic member, the susceptor being characterized in that a portion of the conductor exposed from the ceramic member is covered with a thermally sprayed insulating film.

[Patent Document 1] Japanese Patent Laid-open Application No. H06-279974

An electrostatic chuck generally has a stack structure including a conductive layer and insulating layers between which the conductive layer is interposed. When the conductive layer is exposed to the outside, an electric leakage from the conductive layer may occur, or a metal material of the conductive layer may be corroded by an atmosphere gas. Accordingly, a thermally sprayed film made of an insulating material, such as a ceramic material, is formed at the exposed portion of the conductive layer, i.e., the peripheral side surface of the electrostatic chuck, to cover the exposed portion of the metal layer. However, the thermally sprayed film formed for such purpose may be easily damaged.

FIGS. 5A to 5C illustrate examples of shapes of a thermally sprayed ceramic coating (thermally sprayed layer) formed at the peripheral side surface of an electrostatic chuck in a conventional technique. Generally, as shown in FIG. 5A, a flat thermally sprayed ceramic layer 6 is formed almost entirely at the peripheral side surface of an electrostatic chuck (ESC) 21 including a conductive layer 20. However, since the thermally sprayed ceramic layer 6 is soft, the thermally sprayed ceramic layer 6 may be easily damaged when an external impact is applied to the thermally sprayed ceramic layer 6 during handling, such as installation or separation, of the ESC.

The inventors of the present invention have examined effects of a thermal spraying method of changing a shape or a covering range of the thermally sprayed ceramic layer to prevent the thermally sprayed ceramic layer from being easily peeled off. As one example, as shown in FIG. 5B, the thermally sprayed ceramic layer 6 is extended horizontally from the top and bottom of the thermally sprayed ceramic layer 6 such that the thermally sprayed ceramic layer 6 is formed at the top and bottom of the upper and lower insulating layers as well as at the side of the ESC. As another example, as shown in FIG. 5C, the thermally sprayed ceramic layer 6 is extended only from the bottom of the thermally sprayed ceramic layer 6 such that the thermally sprayed ceramic layer 6 is formed at the bottom of the lower insulating layer as well as at the side of the ESC. The inventors have examined the effects of preventing the thermally sprayed ceramic layer from being peeled off when the thermally sprayed ceramic layer is formed in the above-mentioned shapes.

As a result, the peeling is efficiently prevented by increasing the adhesion area; however, corners of the thermally sprayed ceramic layer are damaged by an external impact since the thermally sprayed ceramic layer is thin and soft. Accordingly, it has been revealed that it is impossible to completely prevent the damage to the thermally sprayed ceramic layer due to an external impact although the thermally sprayed ceramic layer is formed in the shape shown in FIG. 5B or 5C.

Further, Patent Document 1 discloses a study on a method of forming the thermally sprayed ceramic film. Hereinafter, the method of forming the thermally sprayed ceramic film will be described with reference to FIGS. 6A and 6B. In an embodiment of the cited patent document, as shown in FIG. 6A, an upper part of the susceptor has a structure in which a film-shaped electrode 24 is interposed between a disc-shaped ceramic member 22 and a disc-shaped ceramic support 23.

Further, a thermally sprayed film (thermally sprayed layer) is formed as follows. First, as shown in FIG. 6A, a peripheral portion of the film-shaped electrode 24 is removed by etching, and an insulating ceramic material is sprayed into a groove 25 formed by removing the peripheral portion of the film-shaped electrode 24. During spraying, a thermally sprayed ceramic layer 6 is formed to fill the groove 25 and protrude from the sides of the upper and lower ceramic circular plates.

As a result, the thermally sprayed ceramic layer 6 filled in the groove 25 is formed to thereby improve adhesion between the disc-shaped ceramics and the thermally sprayed ceramic layer 6. However, the inventors have found that the thermally sprayed ceramic layer 6 has a protruding portion, which may easily collide with a surrounding object. It is known that, when the protruding portion of the thermally sprayed ceramic layer 6 collides with a surrounding rigid body, an external impact is applied to the thermally sprayed ceramic layer 6, and the thermally sprayed ceramic layer 6 is damaged and easily peeled off.

Further, in an etching process of the peripheral portion of the film-shaped electrode 24 as disclosed in Patent Document 1, the ceramic material is not sufficiently inserted into the processed portion. Accordingly, it is difficult to fully cover the metal layer. Also, since a contact area between the thermally sprayed ceramics and the processed portion is not sufficient, an adhesion strength between the thermally sprayed ceramics and the processed portion is poor and, thus, the thermally sprayed ceramics may be easily peeled off from the processed portion.

SUMMARY OF THE INVENTION

In view of the above, the present invention provides an electrostatic chuck of a stack structure including an conductive layer and insulating layers between which the conductive layer is interposed, wherein the adhesivity between a thermally sprayed ceramic film formed at a periphery of the electrostatic chuck and the electrostatic chuck is high, and the thermally sprayed film is not easily damaged even when an external impact is applied to the electrostatic chuck during handling of the electrostatic chuck.

In accordance with a first aspect of the present invention, there is provided an electrostatic chuck of a stack structure comprising: a metal layer interposed between insulating layers; and a groove formed at a peripheral portion of the electrostatic chuck to have a thickness gradually increasing toward an outside, the groove being covered with a thermally sprayed insulating film.

In the electrostatic chuck, preferably, the thermally sprayed film covers at least a portion of the metal layer exposed at an inside of the groove such that the thermally sprayed film does not protrude from the groove. Accordingly, it is possible to prevent an electric leakage from the metal layer or corrosion of the metal layer, and it is also possible to prevent the damage to the thermally sprayed film even when an external impact is applied to the thermally sprayed film during handling of the electrostatic chuck.

The metal layer may be a conductive layer or a uniform heating layer. Further, preferably, a cross section of the groove has any one selected from a group consisting of a funnel shape, a parabolic shape, a shallow dish shape with a flat bottom, an elliptical arc shape and a circular arc shape. Accordingly, even when the metal layer has a small thickness of about 0.5 mm to about 1.0 mm, a thermally sprayed ceramic is filled in the groove and it is possible to prevent the thermally sprayed film from being peeled off.

Further, preferably, the thermally sprayed film is a ceramic insulating film containing alumina. Further, preferably, the thermally sprayed film is formed by thermally spraying yttrium oxide.

Further, when the thermally sprayed film protrudes from the groove by spraying the ceramic material on the groove, the surface of the thermally sprayed film is ground to remove the protruding portion from the groove. Accordingly, it is possible to prevent the thermally sprayed film from being damaged due to an external impact.

In the electrostatic chuck, the thermally sprayed film can be formed even when the metal layer has a thickness of about 0.5 mm to about 1.0 mm.

In accordance with a second aspect of the present invention, there is provided a method of manufacturing an electrostatic chuck of a stack structure including a metal layer interposed between insulating layers, the method comprising: forming a groove at a peripheral portion of the electrostatic chuck to have a thickness gradually increasing toward an outside; forming a thermally sprayed insulating film to cover at least a portion of the metal layer exposed at the groove; and grinding the thermally sprayed film such that the thermally sprayed film does not protrude from the groove.

Accordingly, it is possible to prevent an electric leakage from the metal layer or corrosion of the metal layer, and it is also possible to manufacture an electrostatic chuck capable of preventing the damage to the thermally sprayed film even when an external impact is applied to the thermally sprayed film during handling of the electrostatic chuck. Further, the metal layer may be a conductive layer or a uniform heating layer.

Preferably, a cross section of the groove has any one selected from a group consisting of a funnel shape, a parabolic shape, a shallow dish shape with a flat bottom, an elliptical arc shape and a circular arc shape. Accordingly, even when the metal layer has a small thickness of about 0.5 mm to about 1.0 mm, a thermally sprayed ceramic is filled in the groove and it is possible to manufacture an electrostatic chuck capable of preventing the thermally sprayed film from being peeled off.

Preferably, the thermally sprayed film is formed by thermally spraying a ceramic material containing alumina. Further, preferably, the thermally sprayed film is formed by thermally spraying yttrium oxide.

In accordance with the aspects of the present invention, it is possible to provide an electrostatic chuck including a thermally sprayed ceramic to cover a metal layer, wherein a thermally sprayed film is not easily damaged even when an external impact is applied to the electrostatic chuck.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Figure 1A:
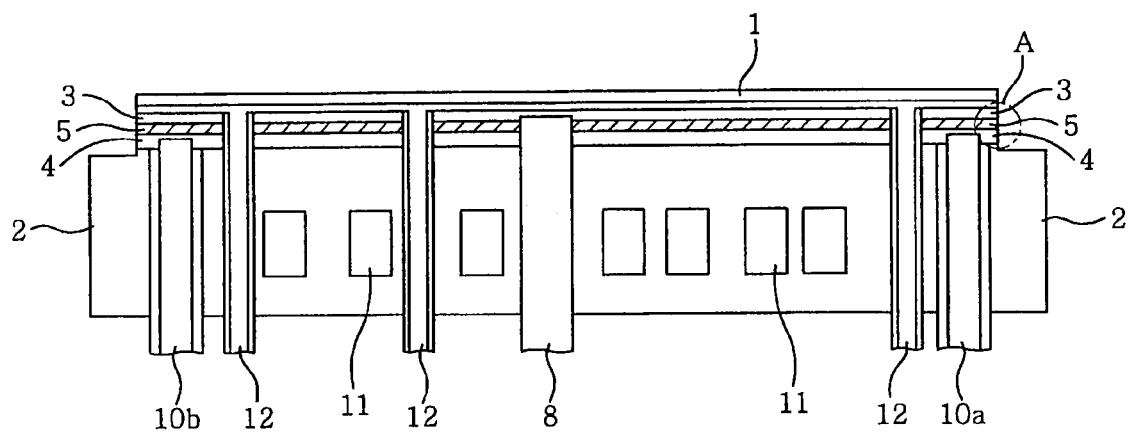
FIGS. 1A and 1B illustrate an upper structure of a mounting table including an electrostatic chuck in accordance with an embodiment of the present invention.
Figure 1B:
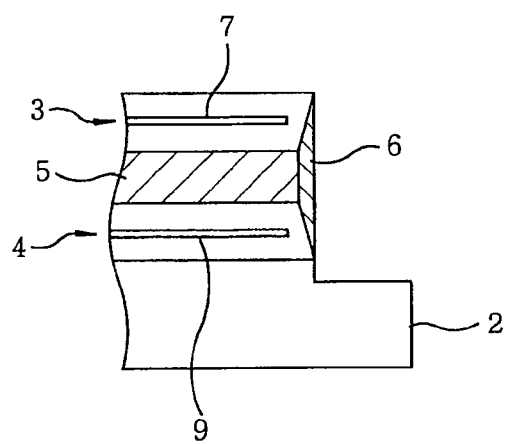

Hereinafter, embodiments of the present invention will be described in detail with reference to the accompanying drawings which form a part hereof. FIGS. 1A and 1B illustrate an upper structure of a mounting table including an electrostatic chuck (ESC) in accordance with an embodiment of the present invention. Specifically, FIG. 1A is a vertical cross sectional view of the mounting table, and FIG. 1B is an enlarged view illustrating a part A of FIG. 1A. A support 2 is in contact with the semiconductor wafer 1 to exchange heat with the semiconductor wafer 1, thereby serving as a heat exchange plate to control the temperature of a semiconductor wafer 1. The support 2 is made of a material, such as aluminum, exhibiting high electric conductivity and thermal conductivity.

At an uppermost portion of the support 2 is disposed a disc-shaped electrostatic chuck layer 3. Below the electrostatic chuck layer 3 is disposed a disc-shaped heater layer 4 made of a ceramic material. Between the electrostatic chuck layer 3 and the heater layer 4 is disposed an aluminum joint layer 5.

The aluminum joint layer 5 functions to render uniform the temperature of the semiconductor wafer 1. At the outer peripheries of the electrostatic chuck layer 3, the heater layer 4 and the aluminum joint layer 5 is formed a thermally sprayed ceramic layer 6.

The electrostatic chuck layer 3 is made of a dielectric, such as a ceramic or the like, to hold the semiconductor wafer 1 with an electrostatic adsorptive force. An internal electrode 7, which is made of a conductor, e.g., a conductive film of copper, tungsten or the like, is embedded in the electrostatic chuck layer 3. When a high voltage, e.g., a DC voltage of 2500 V or 3000 V, is applied to the internal electrode 7 via a power feed rod 8, the semiconductor wafer 1 is adsorptively held by a Coulomb force or a Johnson-Rahbek force.

The heater layer 4 has a structure in which a film-shaped resistance heating layer 9 is formed in a ceramic disc. Power feed lines 10a and 10b are attached to opposite ends of the resistance heating layer 9 such that heating power is supplied to the resistance heating layer 9 from a commercial AC or DC power source (not shown).

A heat transfer medium (fluid) channel 11 is formed in the support 2. A heat transfer medium of a predetermined temperature, such as hot water or cold water, is circulated through and supplied to the heat transfer medium channel 11 by using a temperature control unit and fluid supply and discharge lines (both are not shown).

A heat transfer gas, e.g., a He gas, is supplied between the electrostatic chuck layer 3 and a backside of the semiconductor wafer 1 from a heat transfer gas supply unit (not shown) via gas supply lines 12. The heat transfer gas increases thermal conductivity between the electrostatic chuck layer 3 and the semiconductor wafer 1.

In this embodiment, the electrostatic chuck provided with the heater is employed as described above. The electrostatic chuck has a stack structure in which two ceramic discs having almost the same diameter, forming the electrostatic chuck layer 3 and the heater layer 4, are joined to each other via the aluminum joint layer 5. In this embodiment, alumina is used as the ceramics for the electrostatic chuck layer 3 and the heater layer 4, each of which has a thickness of about 1 to 2 mm. The aluminum joint layer 5 has a thickness of about 0.5 to 1 mm. A total thickness of the electrostatic chuck is about 3 to 5 mm. The aluminum joint layer 5 functions to render uniform the temperature of the semiconductor wafer 1 such that the semiconductor wafer 1 is not uniformly heated by the heater layer 4.

When forming the thermally sprayed ceramic layer 6 at the outer periphery of the disc-shaped stack structure, a groove is formed first such that an outer periphery of the aluminum joint layer 5 is exposed to the outside. The thermally sprayed ceramic layer 6 is then filled in the groove. Finally, a height of the thermally sprayed ceramic layer 6 is adjusted such that the top of the thermally sprayed ceramic layer 6 does not protrude from the peripheral side surface of the stack structure.

Figure 2:
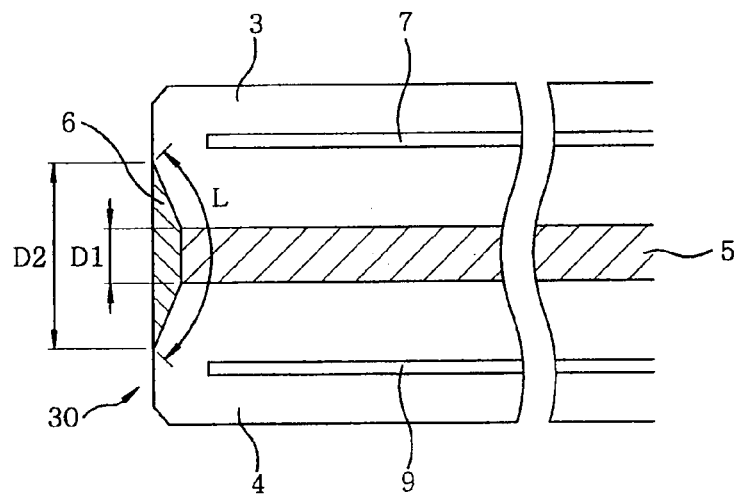
FIG. 2 is a cross sectional view showing a cross sectional shape of a thermally sprayed ceramic layer formed at a peripheral side surface of the electrostatic chuck in accordance with the embodiment of the present invention.

Hereinafter, a cross sectional shape of the groove formed at the peripheral side surface of the stack structure in accordance with the embodiment of the present invention will be described. FIG. 2 is a cross sectional view showing a cross sectional shape of the thermally sprayed ceramic layer 6 formed at the peripheral side surface of the electrostatic chuck in accordance with the embodiment of the present invention.

As shown in FIG. 2, the electrostatic chuck 30 includes the electrostatic chuck layer 3, the heater layer 4 and the aluminum joint layer 5 interposed therebetween. A lower peripheral part of the electrostatic chuck layer 3 and an upper peripheral part of the heater layer 4 are cut to form flat inclined surfaces, thereby forming a groove along the entire peripheral side surface of the electrostatic chuck 30. The groove is formed such that the aluminum joint layer 5 is exposed at the bottom of the groove.

The cross section of the groove may have a shallow funnel shape or a shallow dish shape with a flat bottom. A ceramic spraying material is thermally sprayed such that the thermally sprayed ceramic layer 6 entirely covers the groove. Preferably, yttrium oxide or alumina may be used as the spraying material, but the spraying material is not limited thereto as long as the spraying material forms a ceramic. After spraying, the spraying material protrudes outside the groove. Accordingly, the protruding portion of the spraying material is ground to adjust the height of the thermally sprayed ceramic layer 6 such that the top of the thermally sprayed ceramic layer 6 does not protrude from the peripheral side surface of the stack structure. In other words, the portion of the thermally sprayed ceramic layer 6 sticking out of the groove is removed to render the exposed surface of the thermally sprayed ceramic layer 6 to be flush with the outer peripheral side surfaces of the electrostatic chuck layer 3 and the heater layer 4.

The present invention has the following two features to enhance adhesivity between the thermally sprayed ceramic layer 6 and the ESC. As for a first feature, referring to FIG. 2, the groove is formed to have a cross section in which a thickness of the groove is gradually widened toward the outside (i.e., an outside thickness (D1) of the groove >an inside thickness (D2) of the groove), so that a liquid spaying material can easily reach the bottom (the inside) of the groove during spraying. As for a second feature, as will be described later, the groove is formed such that a total length (L) of the bottom and side walls thereof in the vertical cross section of the groove shown in FIG. 2 is 1.42 mm or more, thereby increasing an adhesion area between the thermally sprayed ceramic layer 6 and the electrostatic chuck 30.

Figure 3A:
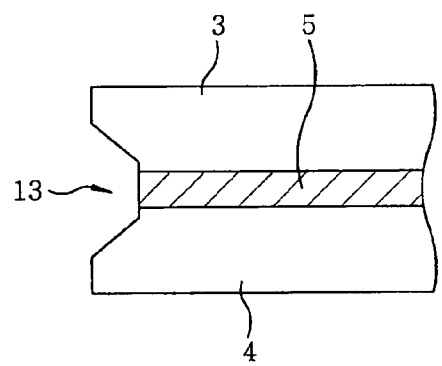
FIGS. 3A to 3D illustrate other examples of cross sectional shapes of a groove formed at the peripheral side surface of the electrostatic chuck in accordance with the embodiment of the present invention.
Figure 3B:
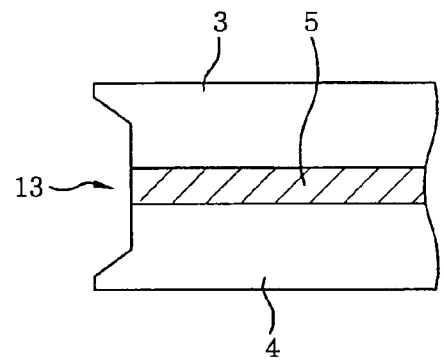
Figure 3C:
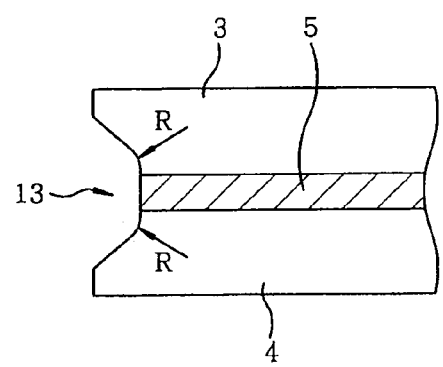
Figure 3D:
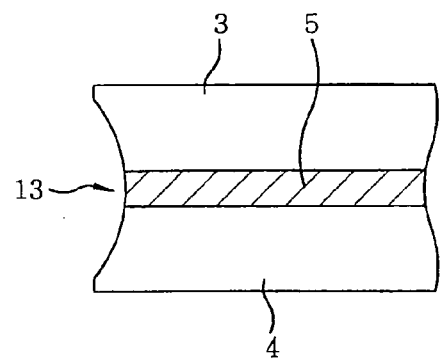

As for the first feature, the cross sectional shape of the groove is not limited to the example of FIG. 2. FIGS. 3A to 3D illustrate other examples of the cross sectional shapes of the groove in accordance with the embodiment of the present invention. As shown in FIG. 3A, the cross section of a groove 13 may have a funnel shape. As shown in FIG. 3B, the cross section of the groove 13 may have a shallow dish shape with a flat bottom. Further, as shown in FIG. 3C, the bottom corner of the funnel may be rounded with a predetermined radius of curvature R. As shown in FIG. 3D, the cross section of the groove 13 may have a circular arc shape. Alternatively, although not shown, the cross section of the groove 13 may have an elliptical arc shape or a parabolic shape. When the cross section of the groove 13 includes a curved shape, the bottom of the groove 13 including the exposed portion of the aluminum joint layer 5 may be flat.

Further, as for the second feature, preferably, the total length (L) of the bottom and side walls of the groove is about 1.42 mm in the cross section of the groove, thereby improving adhesivity of the thermally sprayed ceramic layer 6 to the electrostatic chuck layer 3 and the heater layer 4. Therefore, it is possible to efficiently prevent the thermally sprayed ceramic layer 6 from being peeled off.

Further, the height of the thermally sprayed ceramic layer 6 is adjusted by removing the protruding portion of the thermally sprayed ceramic layer 6 such that the thermally sprayed ceramic layer 6 does not protrude from the peripheral side surface of the stack structure. Consequently, it is possible to prevent the thermally sprayed ceramic layer 6 from being damaged due to the collision between the protruding portion of the thermally sprayed ceramic layer 6 and a surrounding rigid body during handling. The protruding portion of the thermally sprayed ceramic layer 6 may be removed by conventional machining; however, a method of removing the protruding portion of the thermally sprayed ceramic layer 6 is not particularly restricted.

Figure 4A:
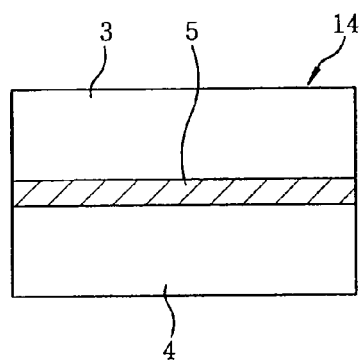
FIGS. 4A to 4D illustrate a method of forming the thermally sprayed ceramic layer in accordance with the embodiment of the present invention.
Figure 4B:
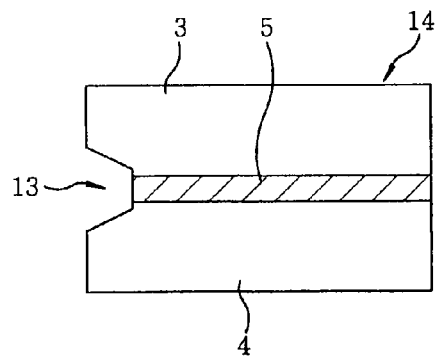

A method of manufacturing the electrostatic chuck, i.e., a method of forming the thermally sprayed ceramic layer 6, in accordance with the embodiment of the present invention, will be described. FIGS. 4A to 4D illustrate a method of forming the thermally sprayed ceramic layer 6 in accordance with the embodiment of the present invention. First, as shown in FIG. 4A, two ceramic discs of the electrostatic chuck layer 3 and the heater layer 4 are joined to each other via the aluminum joint layer 5 to construct a stack structure 14. Subsequently, as shown in FIG. 4B, an outer periphery of the stack structure 14 is ground to form the groove 13 having a specific cross section.

Figure 4C:
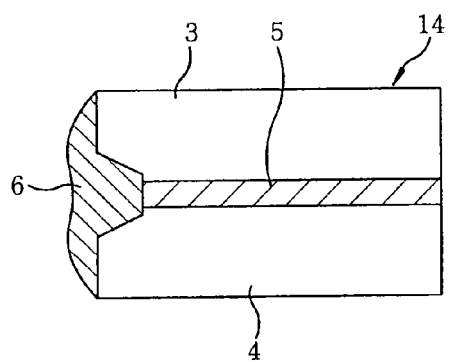
Figure 4D:
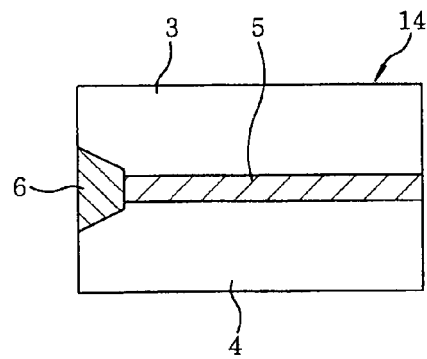
Figure 5A:
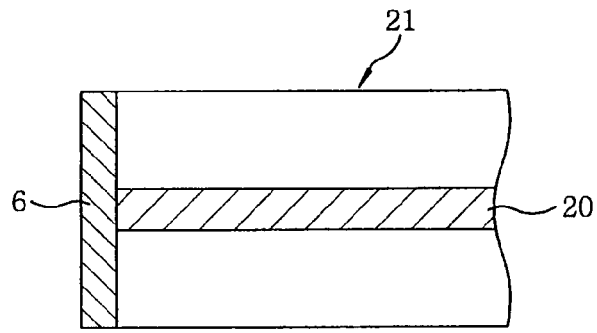
FIGS. 5A to 5C illustrate examples of shapes of a thermally sprayed ceramic layer formed at the peripheral side surface of an electrostatic chuck in a conventional technique.
Figure 5B:
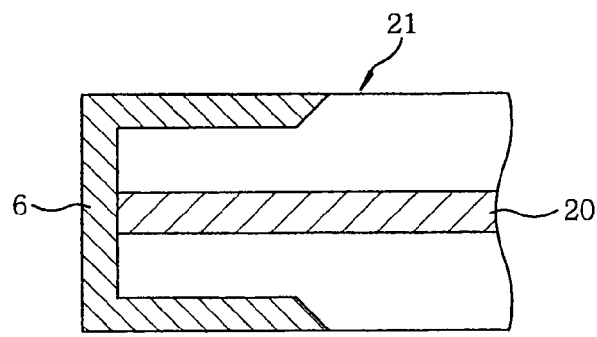
Figure 5C:
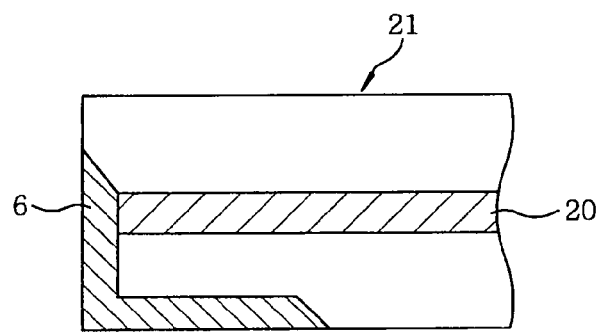
Figure 6A:
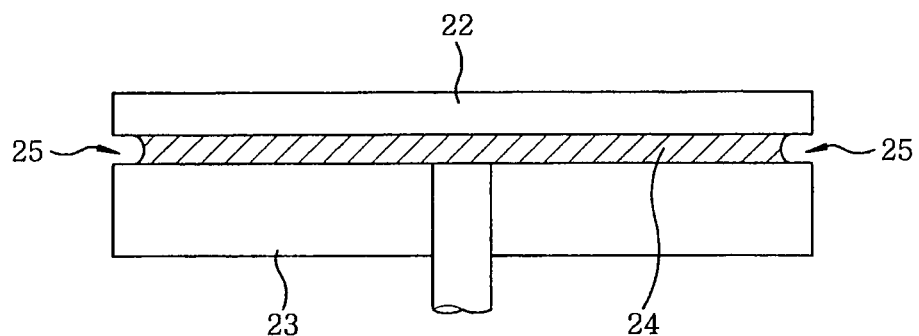
FIGS. 6A and 6B are explanatory diagrams illustrating a conventional method of forming a thermally sprayed ceramic layer.
Figure 6B:
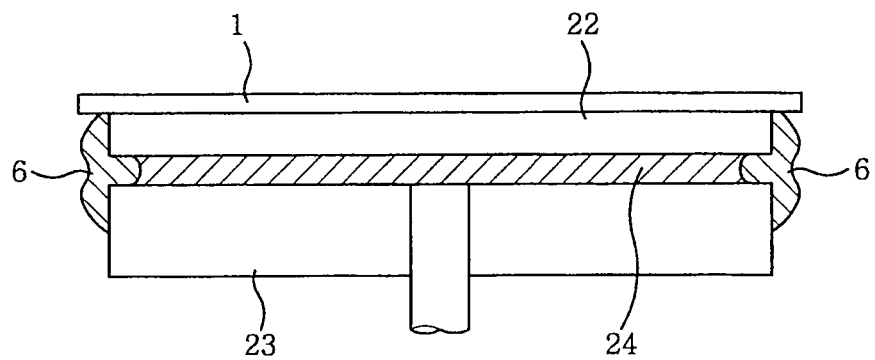

Subsequently, as shown in FIG. 4C, a ceramic spraying material is thermally sprayed to entirely fill the groove 13 at the outer periphery of the stack structure 14 while slightly protruding outward, thereby forming the thermally sprayed ceramic layer 6. In this embodiment, yttrium oxide powder or alumina powder is used as the spraying material. After the thermally sprayed ceramic layer 6 is cooled and solidified, the height of the thermally sprayed ceramic layer 6 is adjusted, such that the top of the thermally sprayed ceramic layer 6 does not protrude from the peripheral side surface of the stack structure 14, by mechanically grinding or polishing the surface of the thermally sprayed ceramic layer 6. As a result, the thermally sprayed ceramic layer 6 is completely formed.

While the invention has been shown and described with respect to the embodiments, it will be understood by those skilled in the art that various changes and modifications may be made without departing from the scope of the invention as defined in the following claims.

What is claimed is:

1. An electrostatic chuck having a stack structure, comprising:
a metal layer interposed between insulating layers,
wherein a groove is formed at a peripheral portion of the electrostatic chuck and includes a groove portion extending outwardly beyond an end of the metal layer, wherein the groove portion has a thickness increasing toward an outside of the groove, the groove being covered with a thermally sprayed insulating film,
wherein upper and lower walls of the groove include upper and lower surfaces of the insulating layers respectively above and below the metal layer, and wherein at least one of the upper and lower surfaces of the insulating layers includes at least one of: (a) a curved surface which is curved relative to a top surface of the metal layer, (b) an inclined surface which is inclined relative to the top surface of the metal layer, and
wherein the thermally sprayed insulating film covers at least a portion of each of the upper and lower surfaces of the insulating layers in the groove.

2. The electrostatic chuck of claim 1, wherein the thermally sprayed film covers at least a portion of the metal layer at an inside of the groove such that the thermally sprayed film does not protrude from the groove.

3. The electrostatic chuck of claim 1, wherein the metal layer is a conductive layer or a uniform heating layer.

4. The electrostatic chuck of claim 1, wherein a cross section of the groove has a shape selected from the group consisting of a funnel shape, a parabolic shape, a shallow dish shape with a flat bottom, an elliptical arc shape, and a circular arc shape.

5. The electrostatic chuck of claim 1, wherein the thermally sprayed film is a ceramic insulating film comprising alumina.

6. The electrostatic chuck of claim 1, wherein the thermally sprayed film is formed by thermally spraying yttrium oxide.

7. The electrostatic chuck of claim 1, wherein a surface of the thermally sprayed film is ground.

8. The electrostatic chuck of claim 1, wherein the metal layer has a thickness of 1.0 mm or less.

9. The electrostatic chuck of claim 1, wherein the thermally sprayed insulating film covers at least a portion of a side surface of each of the insulating layers and an entire surface of the metal layer and does not extend to a bottom surface of a lower one of the insulating layers.

10. The electrostatic chuck of claim 1, wherein each of the upper and lower surfaces of the insulating layers in the groove includes at least one of said curved surface or said inclined surface.

11. The electrostatic chuck of claim 1, wherein immediately beneath the groove, a surface of an insulating layer portion is not covered by the thermally sprayed insulating film, and wherein the thermally sprayed insulating film does not extend beyond a bottom wall of the groove.

12. The electrostatic chuck of claim 1, wherein a cross section of the groove has a curved shape with a flat base.

13. The electrostatic chuck of claim 1, wherein a total length along a base and side walls of the groove is 1.42 mm or more.

* * * * *